United States Patent
Doi et al.

(10) Patent No.: US 12,029,126 B2
(45) Date of Patent: Jul. 2, 2024

(54) COMPOUND AND THERMOELECTRIC CONVERSION MATERIAL

(71) Applicants: Sumitomo Chemical Company, Limited, Tokyo (JP); Riken, Wako (JP)

(72) Inventors: Atsunori Doi, Tsukuba (JP); Satoshi Shimano, Tsukuba (JP); Yasujiro Taguchi, Wako (JP); Yoshinori Tokura, Wako (JP)

(73) Assignees: SUMITOMO CHEMICAL COMPANY, LIMITED, Tokyo (JP); RIKEN, Saitama (JP)

( * ) Notice: Subject to any disclaimer, the term of this patent is extended or adjusted under 35 U.S.C. 154(b) by 186 days.

(21) Appl. No.: 17/297,216

(22) PCT Filed: Dec. 2, 2019

(86) PCT No.: PCT/JP2019/046937
§ 371 (c)(1),
(2) Date: May 26, 2021

(87) PCT Pub. No.: WO2020/116366
PCT Pub. Date: Jun. 11, 2020

(65) Prior Publication Data
US 2022/0029080 A1    Jan. 27, 2022

(30) Foreign Application Priority Data
Dec. 4, 2018 (JP) .................. 2018-227551

(51) Int. Cl.
*H10N 10/852* (2023.01)
*C01B 19/00* (2006.01)

(52) U.S. Cl.
CPC ......... *H10N 10/852* (2023.02); *C01B 19/002* (2013.01); *C01P 2002/52* (2013.01); *C01P 2002/72* (2013.01); *C01P 2002/85* (2013.01); *C01P 2004/03* (2013.01); *C01P 2006/32* (2013.01); *C01P 2006/40* (2013.01)

(58) Field of Classification Search
CPC ......................... H10N 10/852; C01B 19/002
See application file for complete search history.

(56) References Cited

U.S. PATENT DOCUMENTS

| | | |
|---|---|---|
| 3,782,927 A | 1/1974 | Nicolaou |
| 2011/0012069 A1 | 1/2011 | Haass |
| 2011/0017935 A1 | 1/2011 | Park et al. |
| 2013/0009114 A1 | 1/2013 | Park et al. |

FOREIGN PATENT DOCUMENTS

| | | |
|---|---|---|
| CA | 1010815 A | 5/1977 |
| CA | 2715040 A1 | 8/2009 |
| CN | 101977846 A | 2/2011 |

(Continued)

OTHER PUBLICATIONS

English machine translation of Beiss et al. DE 10145389 A1. (Year: 2003).*

(Continued)

*Primary Examiner* — Peter F Godenschwager
(74) *Attorney, Agent, or Firm* — Morgan, Lewis & Bockius LLP

(57) ABSTRACT

A compound containing Sn, Te and Mg, and further containing either one or both of Sb and Bi.

19 Claims, 9 Drawing Sheets

(56) References Cited

FOREIGN PATENT DOCUMENTS

| DE | 10145389 A1 | * | 4/2003 | ............ C22C 13/00 |
| EP | 2708501 A1 | | 3/2014 | |
| JP | 2011-514666 A | | 5/2011 | |
| JP | 2013-219095 A | | 10/2013 | |
| JP | 2014-520202 A | | 8/2014 | |

OTHER PUBLICATIONS

Office Action issued in related Chinese Patent Application No. 201980079902.X dated Feb. 11, 2023.
Banik et al., "Mg Alloying in SnTe Facilitates Valence Band Convergence and Optimizes Thermoelectric Properties," Chemistry of Materials, 27 (2): 581-587 (2015).
Zheng et al., "Interstitial Defects Improving Thermoelectric SnTe in Addition to Band Convergence," ACS Energy Letters, 2 (3): 563-568 (2017).
International Search Report issued in corresponding International Patent Application No. PCT/JP2019/046937 dated Mar. 3, 2020.
Office Action issued in related Japanese Patent Application No. 2020-559159 dated May 31, 2022.
Office Action issued in related Chinese Patent Application No. 201980079864.8 dated Mar. 14, 2023.
Office Action issued in Chinese Patent Application No. 201980079902.X dated Jul. 29, 2023.
Notice of Reasons for Rejection issued in related Japanese Patent Application No. 2020-559174 dated May 31, 2022.
Wu et al., "Synergistically optimized electrical and thermal transport properties of SnTe via alloying high-solubility MnTe," Energy & Environmental Science, 8 (11): 3298-3312 (2015).
International Search Report issued in related International Patent Application No. PCT/JP2019/047017 dated Mar. 3, 2022.
Office Action dated Feb. 3, 2024, issued in corresponding Chinese Patent Application No. 201980079902.X.

* cited by examiner

COMPOUND AND THERMOELECTRIC CONVERSION MATERIAL

TECHNICAL FIELD

The present invention relates to a compound and a thermoelectric conversion material.

Priority is claimed on Japanese Patent Application No. 2018-227551, filed Dec. 4, 2018, the content of which is incorporated herein by reference.

BACKGROUND ART

In recent years, from the viewpoint of suppressing the consumption of energy resources, studies have been conducted on thermoelectric conversion devices utilizing the exhaust heat of automobiles and the exhaust heat of factories that correspond to heat sources in a high temperature region.

In order to recover such exhaust heat by a thermoelectric conversion device and effectively use it as electric power, a compound contained in a thermoelectric conversion material constituting the thermoelectric conversion device is required to have a high power factor in a high temperature region.

As a compound contained in the thermoelectric conversion material, for example, a compound containing Sn, Te and Mg has been reported (Non-Patent Document 1). Further, a compound containing Sn, Te, Mg and Cu has been reported (Non-Patent Document 2).

CITATION LIST

Non-Patent Documents

[[Non-Patent Document 1] Chemistry of Materials, volume 27, Number 2, page 581-587 (2015)
[Non-Patent Document 2] ACS Energy Letters, volume 2, Number 3, page 563-568 (2017)

SUMMARY OF INVENTION

Technical Problem

However, the power factor of a material disclosed in Non-Patent Document 1 or Non-Patent Document 2 in a high temperature region (for example, 300° C.) still had room for improvement.

The present invention has been made in view of the above circumstances, with an object of providing a compound having thermoelectric conversion characteristics and a high power factor in a high temperature region, and a thermoelectric conversion material containing the same.

Solution to Problem

In order to solve the above problems, the present invention includes the following aspects.

[1] A compound containing Sn, Te and Mg, and further containing either one or both of Sb and Bi.

[2] The compound according to [1], which has SnTe as a main phase, and contains either one or both of Sb and Bi, and Mg.

[3] The compound according to [1] or [2], further containing at least one element selected from the group consisting of Mn, In, Na, Al, Si, K, Ca, Sr, Ba, Cu, Ag, Au, Sc, Ti, V, Cr, Fe, Co, Ni, Zn, Ga, Ge, As, Y, Zr, Nb, Mo, Tc, Ru, Rh, Pd, Cd, Cs, La, Ce, Pr, Nd, Pm, Sm, Eu, Gd, Tb, Dy, Ho, Er, Tm, Yb, Lu, Hf, Ta, W, Re, Os, Ir, Pt, Hg, Tl, Pb, S, Se, Cl, Br and I.

[4] The compound according to [3], wherein the aforementioned element is at least one element selected from the group consisting of Cu, In and Se.

[5] The compound according to any one of [1] to [4] which is represented by the following formula (A):

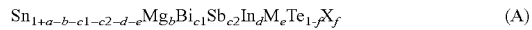

$$Sn_{1+a-b-c1-c2-d-e}Mg_bBi_{c1}Sb_{c2}In_dM_eTe_{1-f}X_f \quad (A)$$

(In the formula (A), M represents at least one element selected from the group consisting of Mn, Na, Al, Si, K, Ca, Sr, Ba, Cu, Ag, Au, Sc, Ti, V, Cr, Fe, Co, Ni, Zn, Ga, Ge, As, Y, Zr, Nb, Mo, Tc, Ru, Rh, Pd, Cd, Cs, La, Ce, Pr, Nd, Pm, Sm, Eu, Gd, Tb, Dy, Ho, Er, Tm, Yb, Lu, Hf, Ta, W, Re, Os, Ir, Pt, Hg, Tl and Pb, X represents at least one element selected from the group consisting of Se, S, Br, I and Cl, and a, b, c1, c2, d, e and f are numbers satisfying: $-0.05 \leq a \leq 0.10$, $0 < b \leq 0.15$, $0 \leq c1 \leq 0.10$, $0 \leq c2 \leq 0.10$, $0 \leq d \leq 0.03$, $0 \leq e \leq 0.20$, and $0 \leq f \leq 0.20$, provided that $0 < c1+c2$.)

[6] A thermoelectric conversion material containing the compound according to any one of [1] to [5].

Advantageous Effects of Invention

According to the present invention, it is possible to provide a compound having thermoelectric conversion characteristics and a high power factor in a high temperature region, and a thermoelectric conversion material containing the same.

DESCRIPTION OF EMBODIMENTS

Figure 1:
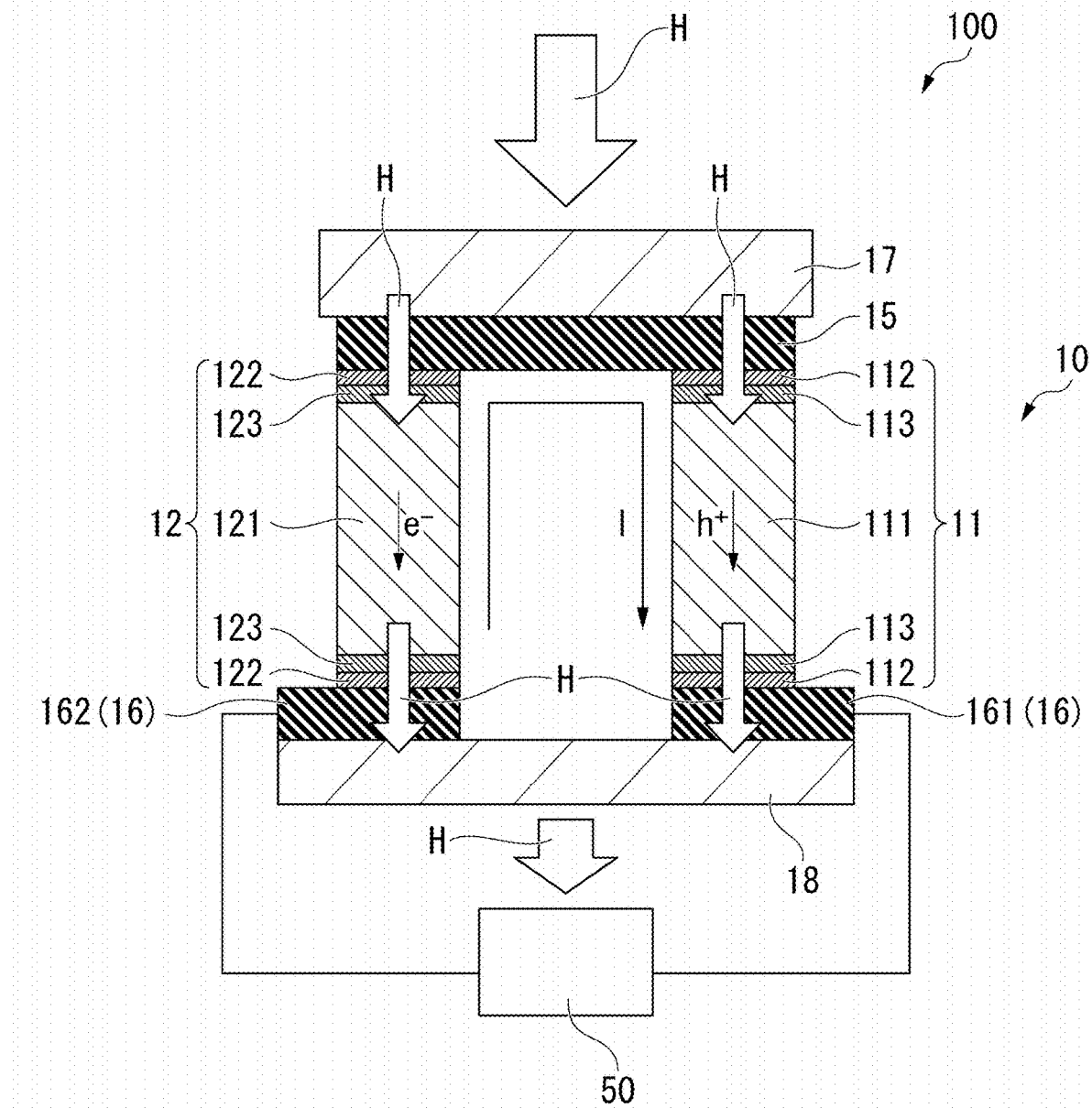
FIG. 1 is a schematic cross-sectional view of a thermoelectric conversion element using a thermoelectric conversion material of the present embodiment as a forming material, and a thermoelectric conversion device having the thermoelectric conversion element.

In the present specification, the term "thermoelectric conversion characteristics" means properties of converting thermal energy into electrical energy by the Seebeck effect, thermomagnetic effect, spin Seebeck effect or the like.

In the present specification, the thermoelectric figure of merit and the power factor are used as indicators of the thermoelectric conversion performance of a thermoelectric conversion material.

The thermoelectric figure of merit is an indicator of the thermal efficiency of thermoelectric conversion by the thermoelectric conversion material. The above thermal efficiency is expressed by the following formula. More specifically, in the thermoelectric conversion using an object formed of the thermoelectric conversion material, the obtained maximum thermal efficiency $\eta_{opt}$ is expressed by the following formula (1).

[Equation 1]

$$\eta_{opt} = \frac{T_H - T_C}{T_H} \frac{\sqrt{1+ZT_{ave}} - 1}{\sqrt{1+ZT_{ave}} + \frac{T_C}{T_H}} \quad (1)$$

In the formula (1), $T_H$ is the temperature of an object formed of a thermoelectric conversion material at the high temperature end [unit: K], $T_C$ is the temperature of the object formed of the thermoelectric conversion material at the low temperature end [unit: K], $T_{ave}$ is the average of $T_H$ and $T_C$ [unit: K], and Z is the average value [1/K] of a thermoelectric figure of merit z of the thermoelectric conversion material in a temperature range.

The term "high temperature end" refers to a relatively high temperature portion in an object formed of a thermoelectric conversion material, among two portions where a temperature difference used for thermoelectric conversion is applied.

The term "low temperature end" refers to a relatively low temperature portion in an object formed of a thermoelectric conversion material, among two portions where a temperature difference used for thermoelectric conversion is applied.

The thermoelectric figure of merit z [1/K] of a thermoelectric conversion material at a given temperature T is expressed by the following formula (2).

[Equation 2]

$$zT = \frac{\alpha^2}{\rho \kappa} T \quad (2)$$

In the formula (2), $\alpha$ represents the Seebeck coefficient [V/K] of a thermoelectric conversion material at a given temperature T, $\rho$ represents the resistivity [Ω·m] of the thermoelectric conversion material at a given temperature T, and $\kappa$ represents the thermal conductivity [W/(m·K)] of the thermoelectric conversion material at a given temperature T.

From the formula (1) and (2), it can be seen that the larger the value of zT represented by the formula (2), the larger the value of $ZT_{ave}$ in a temperature range to be utilized, and the larger the thermal efficiency $\eta_{opt}$ of thermoelectric conversion. That is, in order to increase the thermal efficiency $\eta_{opt}$ of thermoelectric conversion, it is desired that the thermoelectric conversion material exhibits a high thermoelectric figure of merit z in a wide temperature range.

The power factor is an index of the electric power that can be output by thermoelectric conversion when thermoelectric conversion is performed using an object formed of a thermoelectric conversion material. In the above formula (2), the product of the square of the Seebeck coefficient represented by the following formula (3) and the reciprocal of the resistivity is an index representing the electric power that can be output by thermoelectric conversion. The index represented by the formula (3) is referred to as a power factor [W/(m·K²)]. The power factor is sometimes called the power factor.

[Equation 3]

$$\text{Power Factor} = \frac{\alpha^2}{\rho} \quad (3)$$

The power factor represented by the above formula (3) is an index of the maximum electric power that can be output when a certain temperature difference is applied to both ends of an object formed of a thermoelectric conversion material. The power factor serves as an indicator for the maximum electric power output that can be exhibited when a thermoelectric conversion device configured using a thermoelectric conversion material is operated under certain conditions. It shows that the larger the power factor, the larger the maximum electric power output that can be obtained with a thermoelectric conversion device configured using a thermoelectric conversion material.

In the present specification, the term "main phase" means a phase having a main peak with the largest intensity when comparing the main peaks of each phase identified from the X-ray diffraction pattern.

The X-ray diffraction pattern includes a plurality of peaks, and the corresponding phase can be identified for each peak by a known method such as the Hanawalt method.

From the X-ray diffraction pattern, it can be seen that a compound has a single phase or has a plurality of phases. A main peak is present for each identified phase. The term "main peak" means a peak having the largest intensity in a group of peaks assigned to a certain phase.

<Compound>

A compound of the present embodiment contains Sn, Te and Mg, and further contains either one or both of Sb and Bi.

The compound of the present embodiment preferably has SnTe as a main phase, contains either one or both of Sb and Bi, and further contains Mg, in view of improving the power factor.

Descriptions will be provided in order below.

[Crystal Structure of Compound]

A crystal structure of the compound of the present embodiment can be evaluated from, for example, a powder X-ray diffraction pattern obtained by using a powder X-ray diffractometer. The compound of the present embodiment preferably has a SnTe crystal structure as a main phase. The crystal structure of SnTe is cubic with a space group Fm-3m at 25° C.

If the compound of the present embodiment is a compound having a SnTe crystal structure and SnTe as the main phase, when the main peaks in each phase are compared in the X-ray diffraction pattern, the intensity of the main peak of the cubic crystal structure of SnTe with the space group Fm-3m is the strongest among the main peaks of each phase.

As the compound of the present embodiment, in the X-ray diffraction pattern, the ratio of the peak intensity of the main peak of the main phase of the compound with respect to the sum of the peak intensities of the main peaks of all the phases contained in the crystal structure of the compound is preferably more than 50%, more preferably 70% or more, and still more preferably 90% or more. Such a compound becomes a compound having a high power factor in a high temperature region.

[Composition Distribution of Compound]

By producing a composition distribution map of an evaluation sample using, for example, a scanning electron microscope equipped with an energy dispersive X-ray spectrometer, the composition of the compound can be evaluated based on the obtained composition distribution map. More specifically, the composition of the compound is evaluated under conditions in which the composition distribution of 0.2 µm or larger can be clearly identified. Hereinafter, an energy dispersive X-ray spectrometer may be abbreviated as EDX. Further, a scanning electron microscope may be abbreviated as SEM.

In the compound of the present embodiment, the longest diameter of crystals of each element which is unevenly distributed in the compound is preferably equal to or less than 20 µm. In the present specification, the "longest diameter of crystal" can be calculated from a SEM image and means the longest diameter among the diameters (lengths) of each portion on the individual two-dimensional cross section of the crystal of each element which is unevenly distributed in the compound.

[Composition of Compound]

As described above, the compound of the present embodiment is a compound containing Sn, Te and Mg, and further containing either one or both of Sb and Bi.

When the compound contains either one or both of Sb and Bi, the carrier density of the compound can be appropriately adjusted.

When the compound contains Mg, a band structure of a valence band of the compound is adjusted and the Seebeck coefficient of the compound improves.

In another embodiment of the present invention, a compound containing SnTe as the main phase and containing either Sb or Bi and Mg is preferable, and a compound containing SnTe as the main phase and containing Bi and Mg is more preferable. Since such a compound improves the electrical conductivity, the power factor can be improved.

The compound of the present embodiment may further contain at least one element selected from the group consisting of Mn, In, Na, Al, Si, K, Ca, Sr, Ba, Cu, Ag, Au, Sc, Ti, V, Cr, Fe, Co, Ni, Zn, Ga, Ge, As, Y, Zr, Nb, Mo, Tc, Ru, Rh, Pd, Cd, Cs, La, Ce, Pr, Nd, Pm, Sm, Eu, Gd, Tb, Dy, Ho, Er, Tm, Yb, Lu, Hf, Ta, W, Re, Os, Ir, Pt, Hg, Tl, Pb, S, Se, Cl, Br and I.

As the above element, at least one element selected from the group consisting of Cu, In and Se is preferable.

In the compound of the present embodiment, one type of the above element may be contained alone or two or more types thereof may be contained in combination.

As the compound of the present embodiment, a compound represented by the following formula (A) is preferable because the power factor improves.

$$Sn_{1+a-b-c1-c2-d-e}Mg_bBi_{c1}Sb_{c2}In_dM_eTe_{1-f}X_f \quad (A)$$

(In the formula (A), M represents at least one element selected from the group consisting of Mn, Na, Al, Si, K, Ca, Sr, Ba, Cu, Ag, Au, Sc, Ti, V, Cr, Fe, Co, Ni, Zn, Ga, Ge, As, Y, Zr, Nb, Mo, Tc, Ru, Rh, Pd, Cd, Cs, La, Ce, Pr, Nd, Pm, Sm, Eu, Gd, Tb, Dy, Ho, Er, Tm, Yb, Lu, Hf, Ta, W, Re, Os, Ir, Pt, Hg, Tl and Pb, X represents at least one element selected from the group consisting of S, Se, Cl, Br and I, and a, b, c1, c2, d, e and f are numbers satisfying: $0 \leq a \leq 0.10$, $0 < b \leq 0.15$, $0 \leq c1 \leq 0.10$, $0 \leq c2 \leq 0.10$, $0 \leq d \leq 0.03$, $0 \leq e \leq 0.20$, and $0 \leq f \leq 0.20$, provided that $0 \leq c1+c2$.)

In the compound represented by the above formula (A), a is preferably such that: $0 \leq a \leq 0.10$, more preferably $0.02 \leq a \leq 0.08$, and still more preferably $0.03 \leq a \leq 0.07$. In the compound represented by the above formula (A), when a is included in these numerical ranges, either one or both of the Seebeck coefficient and the electrical conductivity of the compound of the present embodiment improve. Therefore, the thermoelectric figure of merit z of the compound represented by the above formula (A) improves.

The upper limit value and the lower limit value of a can be arbitrarily combined.

The amount of substance of Mg in the compound represented by the above formula (A) is represented by b in the above formula (A). In the above formula (A), b is preferably such that: $0 < b \leq 0.15$, more preferably $0.04 \leq b \leq 0.15$, still more preferably $0.04 \leq b \leq 0.13$, and still more preferably $0.07 \leq b \leq 0.12$. In the compound represented by the above formula (A), when the amount of substance (b) of Mg is included in these numerical ranges, the band structure of the above compound is appropriately adjusted and the Seebeck coefficient increases. Therefore, the power factor of the above compound improves.

The upper limit value and the lower limit value of b can be arbitrarily combined.

The amount of substance of Bi in the compound represented by the above formula (A) is represented by c1 in the above formula (A). In the above formula (A), c1 is preferably such that: $0 \leq c1 \leq 0.10$, more preferably $0 \leq c1 \leq 0.07$, still more preferably $0.005 \leq c1 \leq 0.07$, and still more preferably $0.01 \leq c1 \leq 0.06$. In the compound represented by the above formula (A), when the amount of substance (c1) of Bi is included in these numerical ranges, the power factor of the above compound improves.

The upper limit value and the lower limit value of c1 can be arbitrarily combined.

The amount of substance of Sb in the compound represented by the above formula (A) is represented by c2 in the above formula (A). In the above formula (A), c2 is preferably such that: $0 \leq c2 \leq 0.10$, more preferably $0.005 \leq c2 \leq 0.07$, and still more preferably $0.01 \leq c2 \leq 0.06$. Further, in the above formula (A), c2 may be such that $0 \leq c2 \leq 0.07$ or $0 \leq c2 \leq 0.06$. In the compound represented by the above formula (A), when the amount of substance (c2) of Sb is included in these numerical ranges, the power factor of the above compound improves.

The upper limit value and the lower limit value of c2 can be arbitrarily combined.

Since the Seebeck coefficient of the compound represented by the above formula (A) improves by containing In, the power factor improves. The amount of substance of In in the compound represented by the above formula (A) is represented by d in the above formula (A). In the above formula (A), d is preferably such that: $0 \leq d \leq 0.03$, more preferably $0.002 \leq d \leq 0.02$, and still more preferably $0.004 \leq d \leq 0.015$. Further, in the above formula (A), d may be such that $0 \leq d \leq 0.02$ or $0 \leq d \leq 0.015$.

The upper limit value and the lower limit value of d can be arbitrarily combined.

In the compound represented by the above formula (A), the element M is preferably at least one element selected from the group consisting of Mn, Cu and Ag from the viewpoint of improving the thermoelectric figure of merit of the above compound, and Cu is more preferred.

Since the power factor of the compound of the present embodiment improves, it is preferable to have SnTe as the main phase and to contain Bi, Mg and Cu.

The amount of substance of the element M in the compound represented by the above formula (A) is represented by e in the above formula (A). In the above formula (A), e is preferably such that: $0 \leq e \leq 0.10$, more preferably $0.005 \leq e \leq 0.07$, and still more preferably $0.005 \leq e \leq 0.05$ from the viewpoint that it is a range in which physical property control is appropriate. Further, in the above formula (A), e may be such that $0 \leq d \leq 0.07$ or $0 \leq d \leq 0.05$.

The upper limit value and the lower limit value of e can be arbitrarily combined.

In the compound represented by the above formula (A), when Mn is contained as the element M, the amount of substance of Mn in the compound is less than the amount of substance of Mg in the compound.

In the compound represented by the above formula (A), one type of the element M may be contained alone or two or more types thereof may be contained in combination.

In the compound represented by the above formula (A), examples of the element X include at least one element selected from the group consisting of S, Se, Cl, Br and I. The amount of substance of the element X in the compound represented by the above formula (A) is represented by f in the above formula (A). In the above formula (A), f is preferably such that: $0 \leq f \leq 0.20$, more preferably $0.02 \leq f \leq 0.15$, and still more preferably $0.04 \leq f \leq 0.10$.

In the compound represented by the above formula (A), when the amount of substance (f) of the element X is in the above range, the carrier density of the above compound to be described later is controlled in an appropriate range, and the thermoelectric figure of merit z of the above compound can be improved.

The upper limit value and the lower limit value of f can be arbitrarily combined.

The compound represented by the above formula (A) preferably contains either one or both of Se and S as the element X. When the compound represented by the above formula (A) contains Se or S as the element X, there is an effect of lowering the thermal conductivity of the above compound, and it becomes possible to improve the thermoelectric figure of merit z of the above compound.

In the compound represented by the above formula (A), one type of the element X may be contained alone or two or more types thereof may be contained in combination.

An example of preferred combinations of the numerical ranges of a, b, c1, c2, d, e and f for the compound represented by the above formula (A) is: $0.02 \leq a \leq 0.08$, $0.04 \leq b \leq 0.15$, $0 \leq c1 \leq 0.07$, $0 \leq c2 \leq 0.10$, $0 \leq d \leq 0.03$, $0 \leq e \leq 0.10$ and $0 \leq f \leq 0.20$.

[Carrier Density]

In the present specification, a carrier is an electron or a hole. The carrier density indicates the abundance of electrons or holes in the compound per unit volume.

The carrier density of the compound of the present embodiment is preferably $8.0 \times 10^{20}$ cm$^{-3}$ or less since it increases the Seebeck coefficient within a range in which the resistivity of the thermoelectric conversion material containing the above compound does not increase too much, and improves the power factor and the thermoelectric figure of merit of the above compound. Since the thermoelectric figure of merit z improves in the vicinity of room temperature and in a high temperature region, the carrier density of the compound of the present embodiment is more preferably $0.5 \times 10^{20}$ cm$^{-3}$ or more and $4.0 \times 10^{20}$ cm$^{-3}$ or less, and still more preferably $0.8 \times 10^{20}$ cm$^{-3}$ or more and $2.5 \times 10^{20}$ cm$^{-3}$ or less.

The carrier density of a compound can be controlled by changing the composition ratio of the elements contained in the compound. Further, the carrier density of a compound can be controlled by replacing the element contained in the compound with another element.

When controlling the carrier density of a compound, changing of the composition ratio of the elements contained in the compound and replacement of the element contained in the compound with another element may be combined.

In the present embodiment, for example, the carrier density can be further reduced by replacing a portion of Sn in the compound with Bi or Sb. As another example, the carrier density can be further reduced by replacing a portion of Te in the compound of the present embodiment with S, Se, Cl, Br or I.

In the present embodiment, for the measurement of the carrier density of the compound, for example, five-terminal Hall measurement with a physical characteristic measuring device PPMS (manufactured by Quantum Design Inc.) and a dedicated DC resistance sample pack can be employed. The Hall measurement can be performed by stabilizing the temperature of a sample to be measured and applying a magnetic field perpendicularly to one surface of the sample to measure the Hall resistance. The Hall coefficient can be calculated from a slope of the Hall resistance with respect to the magnetic field, and then the carrier density can be calculated from the Hall coefficient.

[Seebeck Coefficient]

From the viewpoint of improving the thermoelectric figure of merit z and the power factor that are values represented by the formula (2), the Seebeck coefficient of the compound of the present embodiment at each temperature is preferably within the following range.

The Seebeck coefficient [μV/K] at 100° C. is preferably 40 or more, and more preferably 50 or more.

The Seebeck coefficient [μV/K] at 200° C. is preferably 70 or more, more preferably 80 or more, and still more preferably 90 or more.

The Seebeck coefficient [μV/K] at 300° C. is preferably 90 or more, more preferably 100 or more, and still more preferably 110 or more.

The Seebeck coefficient [μV/K] at 400° C. is preferably 100 or more, more preferably 110 or more, and still more preferably 120 or more.

The Seebeck coefficient [μV/K] at 500° C. is preferably 110 or more, more preferably 120 or more, and still more preferably 130 or more.

The Seebeck coefficient can be controlled by replacing the element contained in the compound of the present embodiment with another element.

For example, the band structure of the valence band of SnTe can be adjusted by replacing a portion of Sn in the compound of the present embodiment with Mg. At that time, by replacing a portion of Sn with an appropriate amount of Mg, the band structure of the valence band is adjusted, the state density in the vicinity of the Fermi level increases, and the Seebeck coefficient of the compound of the present embodiment improves. The "appropriate amount" is, for example, 10% of the amount of substance of Sn.

Further, by replacing a portion of Sn in the compound of the present embodiment with In, the resonance level of the compound of the present embodiment can be formed in the vicinity of the Fermi level. As a result, the state density in the vicinity of the Fermi level increases, and the Seebeck coefficient of the compound of the present embodiment improves. The amount of replacement by In is, for example, 1% of the amount of substance of Sn.

Further, by replacing a portion of Sn in the compound of the present embodiment with Bi or Sb, the carrier density can be controlled and the Seebeck coefficient of the compound can be improved.

In the compound of the present embodiment, in order to improve the Seebeck coefficient, it is preferable to replace a portion of Sn in the above compound with either one or both of Sb and Bi, and to further replace a portion of Sn in the compound of the present embodiment with either one or both of Mg and In.

<Method for Producing Compound>

Next, a method for producing the compound of the present embodiment will be described.

First Embodiment

A method for producing a compound in the first embodiment includes: a step of mixing raw materials containing Sn, Mg and Te, and either one or both elements of Sb and Bi and heating and melting them at 780° C. or higher to obtain a melt; and a step of quenching the melt with a liquid of less than 50° C. In the following description, the step of obtaining a melt is referred to as "melting step", and the step of quenching is referred to as "quenching step".

[Melting Step]

Examples of raw materials used in the melting step include metals, metal salts, and non-metals. Examples of the form of the raw material include powders, particles, and ingots.

Examples of the above metal include Sn, Mg, Bi, Sb, Mn, In, Na, Al, Si, K, Ca, Sr, Ba, Cu, Ag, Au, Sc, Ti, V, Cr, Fe, Co, Ni, Zn, Ga, Ge, As, Y, Zr, Nb, Mo, Tc, Ru, Rh, Pd, Cd, Cs, La, Ce, Pr, Nd, Pm, Sm, Eu, Gd, Tb, Dy, Ho, Er, Tm, Yb, Lu, Hf, Ta, W, Re, Os, Ir, Pt, Hg, Tl and Pb. Only one type of these metals may be used, or two or more types thereof may be used in combination.

Examples of the above metal salt include metal salts having the above metal as a metal cation. The counter anion of the metal salt is not particularly limited, and examples thereof include a halide ion of $Br^-$, $Cl^-$, $I^-$ or $F^-$, and a group 16 anion of $S^{2-}$, $Se^{2-}$ or $Te^{3-}$.

Examples of the above non-metal include a simple substance of S, Se or Te.

The composition ratio (molar ratio) of each element contained in the raw material is controlled in accordance with the composition ratio of the compound as a final product.

The maximum temperature during heating in the melting step is 780° C. or higher. The maximum temperature during heating is preferably 900° C. or higher because the composition distribution of the obtained melt tends to become uniform.

In the melting step, the melting method is not particularly limited, and examples thereof include heating with a resistance heating element, heating with a high frequency induction furnace, arc melting, and electron beam melting.

For the material of a "crucible" used at the time of melting, graphite, alumina, cold crucibles and the like are used in accordance with the heating method.

In order to prevent the above-mentioned raw materials and the melt obtained in the melting step from deteriorating, it is preferable to heat the raw materials in an inert atmosphere such as argon, nitrogen or a vacuum in the melting step. In the melting step, the raw material may be packed and heated in an ampoule tube whose inside is replaced with an inert atmosphere. When an ampoule tube is used in the melting step, the inner wall of the ampoule tube may be coated with carbon in order to prevent the raw material from reacting with the ampoule tube.

[Quenching Step]

In the quenching step of the present embodiment, it is preferable to rapidly cool the melt obtained in the melting step to 100° C. or lower. More specifically, in the cooling step, it is preferable to cool the melt to 100° C. or lower within 10 minutes, more preferably within 5 minutes, and still more preferably within 1 minute.

As the above liquid, a liquid having a boiling point of 100° C. or lower, such as water, liquid air and liquid nitrogen can be used. Water is preferred because it is inexpensive and highly safe.

In the method for producing a compound of the first embodiment, by including a quenching step, Mg, Bi and Sb can be solid-solved in a supersaturated state in the crystal lattice of SnTe as the main phase. As a result, the power factor of the above compound improves due to improvement in the electrical conductivity of the compound.

Second Embodiment

A method for producing a compound in the second embodiment includes: a step of cooling the melt obtained in the above-mentioned melting step without quenching, and obtaining a material containing at least Sn, Mg and Te, and either one or both of Sb and Bi; a step of pulverizing the obtained material to obtain a material powder; and a step of sintering the material powder at 400° C. or higher by using a plasma sintering method. In the following description, the step of obtaining the material is referred to as a "material producing step", the step of obtaining the material powder is referred to as a "pulverizing step", and the step of sintering the material powder is referred to as a "plasma sintering step".

[Material Producing Step]

In the material producing step, the melt obtained in the melting step is cooled to 100° C. or lower over a time longer than 10 minutes without using the above liquid.

[Pulverizing Step]

In the pulverizing step, the material obtained in the material producing step is ground and pulverized with a ball mill or the like. The particle size of the pulverized fine particles is not particularly limited, but is preferably 150 μm or less.

[Plasma Sintering Step]

In the plasma sintering step, while pressurizing the material powder obtained in the pulverizing step, a pulsed electric current is applied to the material powder. As a result, an electrical discharge is generated between the material powders, and the material powders can be heated and sintered.

In order to prevent the obtained compound from deteriorating due to contact with air, the plasma sintering step is preferably carried out in an inert atmosphere such as argon, nitrogen or a vacuum.

The applied pressure in the plasma sintering step is preferably in the range of more than 0 MPa and 100 MPa or less. In order to obtain a high density compound, the applied pressure in the plasma sintering step is preferably 10 MPa or higher, and more preferably 30 MPa or higher.

The heating temperature in the plasma sintering step is preferably sufficiently lower than the melting point of the compound as a desired product, and preferably equal to or less than 700° C. The heating temperature in the plasma sintering step is more preferably equal to or less than 650° C. The heating temperature in the plasma sintering step is preferably equal to or more than 400° C., and more preferably equal to or more than 500° C. in order to promote sintering.

The upper limit value and the lower limit value of the heating temperature in the plasma sintering step can be arbitrarily combined.

In the plasma sintering step, the heating stops when the energization is stopped, and the material powder is cooled rapidly. In the plasma sintering step, in order to suppress uneven distribution of elements contained in the obtained compound, it is preferable that the heating is carried out at the above heating temperature and then the energization is stopped for cooling.

In the method for producing a compound of the second embodiment, by including a plasma sintering step, the material can be rapidly cooled, and Mg, Bi and Sb can be solid-solved in a supersaturated state in the crystal lattice of SnTe as the main phase.

Third Embodiment

A method for producing a compound in the third embodiment includes: a step of mixing raw materials containing Sn, Mg and Te, and either one or both elements of Sb and Bi and heating and melting them at 780° C. or higher to obtain a melt (melting step); a step of quenching the melt with a liquid of less than 50° C. (quenching step); a step of pulverizing the obtained material to obtain a material powder (pulverizing step); and a step of sintering the material powder at 400° C. or higher by using a plasma sintering method (plasma sintering step).

Descriptions relating to the melting step, the quenching step, the pulverizing step and the plasma sintering step in the present embodiment are the same as the descriptions provided above for the melting step and the quenching step in the first embodiment of the method for producing a compound, and the pulverizing step and the plasma sintering step in the second embodiment of the method for producing a compound.

As a method for producing a compound, the method for producing a compound according to the third embodiment is preferable. Since the production method of the third embodiment employs both the quenching step and the plasma sintering step in combination, Mg, Bi and Sb can be solid-solved in a sufficiently supersaturated state in the crystal lattice of SnTe as the main phase of the obtained compound. As a result, the electrical conductivity of the compound obtained by the method for producing a compound improves, and the power factor of the obtained compound improves.

<Thermoelectric Conversion Material>

The thermoelectric conversion material in the present embodiment is a material containing the above-mentioned compound of the present embodiment and having thermoelectric conversion characteristics.

The thermoelectric conversion material in the present embodiment may contain one type of the above-mentioned compound of the present embodiment alone or two or more types thereof may be contained in combination.

The content of the compound of the present embodiment described above in the thermoelectric conversion material is preferably 50% by mass or more and 100% by mass or less, more preferably 70% by mass or more and 100% by mass or less, still more preferably 80% by mass or more and 100% by mass or less, and still more preferably 90% by mass or more and 100% by mass or less. In the thermoelectric conversion material, when the content of the compound of the present embodiment described above is within the above range, the power factor improves.

The thermoelectric conversion material can contain, for example, a polymer compound, glass, ceramic and the like, in addition to the compound of the present embodiment described above.

The polymer compound that can be contained in the thermoelectric conversion material is not particularly limited, and examples thereof include acrylic resins, terephthalate resins, engineering plastics, fluororesins, polyethylenes, polypropylenes, epoxy resins, diallyl phthalate resins, silicone resins, phenol resins, polyester resins, polyimide resins, polyurethane resins and melamine resins.

The glass that can be contained in the thermoelectric conversion material is not particularly limited, and examples thereof include quartz glass, borosilicate glass and non-alkali glass.

The ceramic that can be contained in the thermoelectric conversion material is not particularly limited, and examples thereof include alumina, titania, zirconia, silicon nitride, silicon carbide, cordierite, ferrite, barium titanate, lead zirconate titanate, forsterite, zircon, mullite, aluminum nitride, mica, boron nitride, titanium carbide and zinc oxide.

Since the thermoelectric conversion material as described above uses a compound having a high power factor in a high temperature region, it is possible to produce a thermoelectric conversion device excellent in thermal efficiency in a high temperature region.

<Thermoelectric Conversion Element, Thermoelectric Conversion Device>

FIG. 1 is a schematic cross-sectional view of a thermoelectric conversion element using the above-mentioned thermoelectric conversion material as a forming material, and a thermoelectric conversion device having the thermoelectric conversion element.

In the present specification, a "thermoelectric conversion element" is an element that converts thermal energy into electrical energy by utilizing the Seebeck effect, thermomagnetic effect, spin Seebeck effect and the like.

Figure 4:
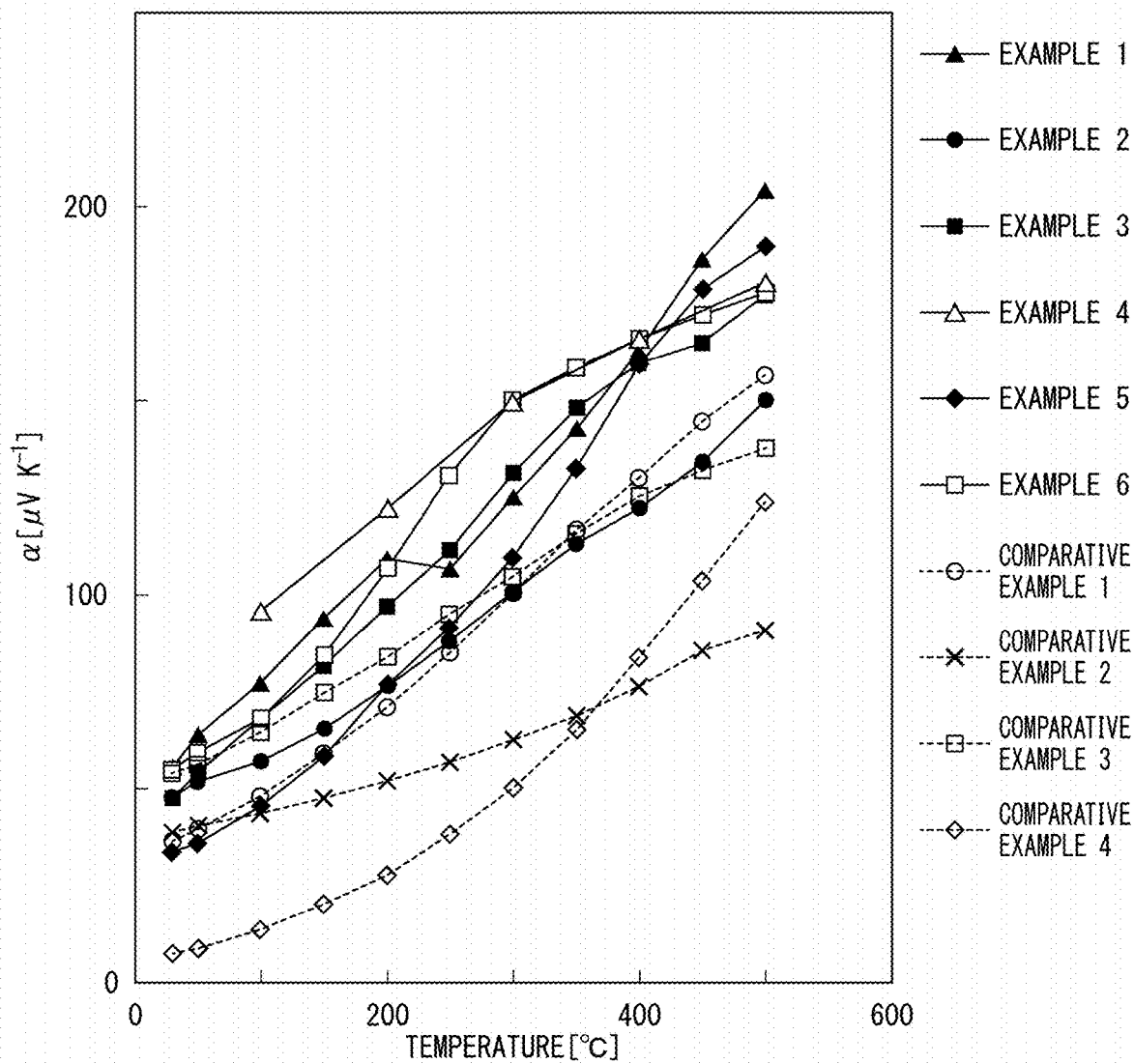
FIG. 4 is a graph showing the temperature dependence of Seebeck coefficients α of compounds of Examples 1 to 6 and Comparative Examples 1 to 4.

A thermoelectric conversion device 10 shown in FIG. 4 has a p-type thermoelectric conversion element 11, an n-type thermoelectric conversion element 12, a high temperature side electrode 15 and a low temperature side electrode 16. The low temperature side electrode 16 includes an electrode 161 and an electrode 162.

In the following description, the relative position of each member may be described with the side where the high temperature side electrode 15 is arranged as being "upper" and the side where the low temperature side electrode 16 is arranged as being "lower" in the thermoelectric conversion device 10. For example, "upper" of the phrase "upper side" or "lower" of the phrase "lower end" also has the same meaning.

Further, in the following description, when the p-type thermoelectric conversion element 11 and the n-type thermoelectric conversion element 12 are collectively referred to, they may be simply referred to as "thermoelectric conversion elements".

The p-type thermoelectric conversion element 11 has a thermoelectric conversion layer 111. Further, as shown in the drawing, the p-type thermoelectric conversion element 11 may have a bonding layer 112 and a diffusion prevention layer 113.

The thermoelectric conversion layer 111 is an element that generates a thermoelectromotive force due to movement of positively charged holes (h⁺) from a place where the temperature is high to a place where the temperature is low when a temperature difference is generated in the element. The thermoelectric conversion layer 111 is formed by using a thermoelectric conversion material having p-type electronic properties and a positive Seebeck coefficient. For example, the thermoelectric conversion layer 111 can be obtained by machining the thermoelectric conversion material of the present embodiment described above into a desired shape. For example, the thermoelectric conversion layer 111 has a columnar shape.

The bonding layer 112 is provided between the thermoelectric conversion layer 111 and the high temperature side electrode 15. The bonding layer 112 electrically and mechanically joins the thermoelectric conversion layer 111 and the high temperature side electrode 15 in a favorable manner. As a result, the bonding layer 112 reduces the contact resistance between the thermoelectric conversion layer 111 and the high temperature side electrode 15.

Further, the bonding layer 112 is provided between the thermoelectric conversion layer 111 and the electrode 161 (low temperature side electrode 16). The bonding layer 112 electrically and mechanically joins the thermoelectric conversion layer 111 and the electrode 161 in a favorable manner. As a result, the bonding layer 112 reduces the contact resistance between the thermoelectric conversion layer 111 and the electrode 161.

Examples of the forming material of the bonding layer 112 include elements that increase the carrier density of the thermoelectric conversion element, and silver, gold and platinum are preferred.

The thickness of the bonding layer 112 is not particularly limited, but is preferably 0.001 µm or more and 20 µm or less, and more preferably 0.005 µm or more and 10 µm or less. The upper limit value and the lower limit value of the thickness of the bonding layer 112 can be arbitrarily combined.

The diffusion prevention layer 113 is provided between the thermoelectric conversion layer 111 and the bonding layer 112. When the thermoelectric conversion layer 111 is brought into contact with a member containing another metal material such as the bonding layer 112, the high temperature side electrode 15, and the electrode 161 (low temperature side electrode 16), the elements constituting the thermoelectric conversion material may diffuse to the bonding layer 112 and the electrodes (the high temperature side electrode 15 and the low temperature side electrode 16), or the elements constituting the bonding layer 112 and the electrodes may diffuse to the thermoelectric conversion layer 111. The diffusion prevention layer 113 suppresses the above-mentioned diffusion and suppresses deterioration of the thermoelectric conversion layer 111 due to the above-mentioned diffusion.

As the forming material of the diffusion prevention layer 113, for example, at least one element selected from the group consisting of aluminum, titanium, chromium, iron, cobalt, nickel, copper, zinc, molybdenum, silver and tantalum is preferable, and at least one element selected from the group consisting of aluminum, titanium, chromium, iron, cobalt, nickel, zinc, molybdenum and tantalum is more preferable.

As the forming material of the diffusion prevention layer 113, a composite material in which two or more types of the above-mentioned forming materials are combined is preferable, and a composite material in which two or more types, among the above-mentioned forming materials, selected from the group consisting of aluminum, titanium, chromium, iron, cobalt, nickel, zinc, molybdenum and tantalum are combined is more preferable.

The thickness of the diffusion prevention layer 113 is not particularly limited, but is preferably 0.5 µm or more and 100 µm or less, and more preferably 0.1 µm or more and 50 µm or less. The upper limit value and the lower limit value of the thickness of the diffusion prevention layer 113 can be arbitrarily combined.

The n-type thermoelectric conversion element 12 has a thermoelectric conversion layer 121. Further, as shown in the drawing, the n-type thermoelectric conversion element 12 may have a bonding layer 122 and a diffusion prevention layer 123.

The thermoelectric conversion layer 121 is an element that generates a thermoelectromotive force due to movement of negatively charged electrons (e) from a place where the temperature is high to a place where the temperature is low when a temperature difference is generated in the element. The thermoelectric conversion layer 121 is formed by using a thermoelectric conversion material having n-type electronic properties and a negative Seebeck coefficient. For example, the thermoelectric conversion layer 121 can be obtained by machining the thermoelectric conversion material of the present embodiment described above into a desired shape. For example, the thermoelectric conversion layer 121 has a columnar shape.

The compound of the present embodiment may be a compound having p-type electronic properties or a compound having n-type electronic properties by changing the content of Sb or Bi contained in the compound to control the carrier density. The electronic properties of the thermoelectric conversion material can be controlled by using a compound having the desired electronic properties as a material of the thermoelectric conversion material.

The bonding layer 122 is provided between the thermoelectric conversion layer 121 and the high temperature side electrode 15. The bonding layer 122 electrically and mechanically joins the thermoelectric conversion layer 121 and the high temperature side electrode 15 in a favorable manner. As a result, the bonding layer 122 reduces the contact resistance between the thermoelectric conversion layer 121 and the high temperature side electrode 15.

The bonding layer 122 is provided between the thermoelectric conversion layer 121 and the electrode 162 (low temperature side electrode 16). The bonding layer 122 electrically and mechanically joins the thermoelectric conversion layer 121 and the electrode 162 in a favorable manner. As a result, the bonding layer 122 reduces the contact resistance between the thermoelectric conversion layer 121 and the electrode 162.

As the forming material of the bonding layer 122 and the thickness of the bonding layer 122, the same configurations as those of the bonding layer 112 described above can be adopted.

The diffusion prevention layer 123 is provided between the thermoelectric conversion layer 121 and the bonding layer 122. The diffusion prevention layer 123 suppresses diffusion of the elements constituting the thermoelectric conversion material to the bonding layer 122 and the electrodes (the high temperature side electrode 15 and the low temperature side electrode 16), or diffusion of the elements constituting the bonding layer 122 and the electrodes to the thermoelectric conversion layer 121, and suppresses deterioration of the thermoelectric conversion layer 121 due to the diffusion.

As the forming material of the diffusion prevention layer 123 and the thickness of the diffusion prevention layer 123, the same configurations as those of the diffusion prevention layer 113 described above can be adopted.

The p-type thermoelectric conversion element 11 and the n-type thermoelectric conversion element 12 may have a protective film on the surface of the thermoelectric conversion element that may be brought into contact with the gas in the environment in which the thermoelectric conversion element is placed. When the thermoelectric conversion elements have the above-mentioned protective film, it is possible to suppress the reaction between the thermoelectric conversion material included in the thermoelectric conversion element and the gas in the environment in which the thermoelectric conversion element is placed, and to suppress diffusion of a substance that may be generated from the thermoelectric conversion material. Examples of the elements contained in the protective film include silicon and oxygen. The thickness of the protective film is not particularly limited, but is preferably 0.5 μm or more and 100 μm or less, and more preferably 1 μm or more and 50 μm or less.

The high temperature side electrode 15 and the low temperature side electrode 16 use, for example, copper having high electrical conductivity and thermal conductivity as a forming material.

The thermoelectric conversion device 10 has an insulating plate 17 that covers the high temperature side electrode 15. The insulating plate 17 has a function of reinforcing the thermoelectric conversion device 10. Examples of the forming material of the insulating plate 17 include ceramic plates of alumina, aluminum nitride and the like.

The thermoelectric conversion device 10 has a radiator plate 18 that covers the low temperature side electrode 16. The radiator plate 18 has a function of reinforcing the thermoelectric conversion device 10 and promoting heat dissipation from the thermoelectric conversion element. Since the thermoelectric conversion device 10 has the radiator plate 18, a temperature difference (temperature gradient) in the thermoelectric conversion element is easily formed, and a thermoelectromotive force is easily generated.

Examples of the forming material of the radiator plate 18 include ceramic plates of alumina, aluminum nitride and the like having insulating properties.

Next, an operation of the thermoelectric conversion device 10 will be described.

First, heat H is transmitted to the thermoelectric conversion device 10 from a heat source (not shown) arranged on the upper side of the thermoelectric conversion device 10. Inside the thermoelectric conversion device 10, the heat H transmitted from the insulating plate 17 to the high temperature side electrode 15 is further transmitted to an upper portion of the thermoelectric conversion element via the high temperature side electrode 15.

Further, inside the thermoelectric conversion device 10, the heat H of the thermoelectric conversion element is transmitted to the radiator plate 18 via the low temperature side electrode 16.

As a result, in the p-type thermoelectric conversion element 11 and the n-type thermoelectric conversion element 12, a temperature gradient is generated between the upper end portion and the lower end portion.

In the p-type thermoelectric conversion element 11, a thermoelectromotive force is generated by the movement of holes ($h^+$) from the upper end portion where the temperature is high to the lower end portion where the temperature is low. On the other hand, in the n-type thermoelectric conversion element 12, a thermoelectromotive force is generated by the movement of electrons ($e^-$) from the upper end portion where the temperature is high to the lower end portion where the temperature is low. The potential difference in the p-type thermoelectric conversion element 11 and the potential difference in the n-type thermoelectric conversion element 12 are reversed in the vertical direction. Therefore, by electrically connecting the upper end portions of both the p-type thermoelectric conversion element 11 and the n-type thermoelectric conversion element 12 with the high temperature side electrode 15, a connected thermoelectric conversion device in which the p-type thermoelectric conversion element 11 and the n-type thermoelectric conversion element 12 are directly connected can be configured.

In the thermoelectric conversion device 10, the electromotive force between the electrodes 161 and 162 is the sum of the thermoelectromotive force of the p-type thermoelectric conversion element 11 and the thermoelectromotive force of the n-type thermoelectric conversion element 12. When heat H is input from the upper side of the thermoelectric conversion device 10, an electric current I is generated from the electrode 162 toward the electrode 161.

Such a thermoelectric conversion device 10 can be used as a power source for an external load 50 by connecting the electrodes 161 and 162 to the external load 50. Examples of the external load 50 include a battery, a capacitor and a motor serving as a part of an electrical device.

In the thermoelectric conversion device 10 as described above, since the thermoelectric conversion element of the present embodiment is used as the material of the thermoelectric conversion element, the thermoelectric conversion device excellent in thermal efficiency in a high temperature region is configured.

It should be noted that the compound and the thermoelectric conversion material of the present embodiment can also be adopted for a thermoelectric conversion device using thermomagnetic effects such as the Nernst effect, the Righi-Leduc effect and the Maggi-Righi-Leduc effect, or a thermoelectric conversion device using the spin Seebeck effect due to the spin pumping effect, the inverse spin Hall effect and the like, in addition to the conventional thermoelectric conversion device using the Seebeck effect.

<Thermoelectric Conversion Module>

Figure 2:
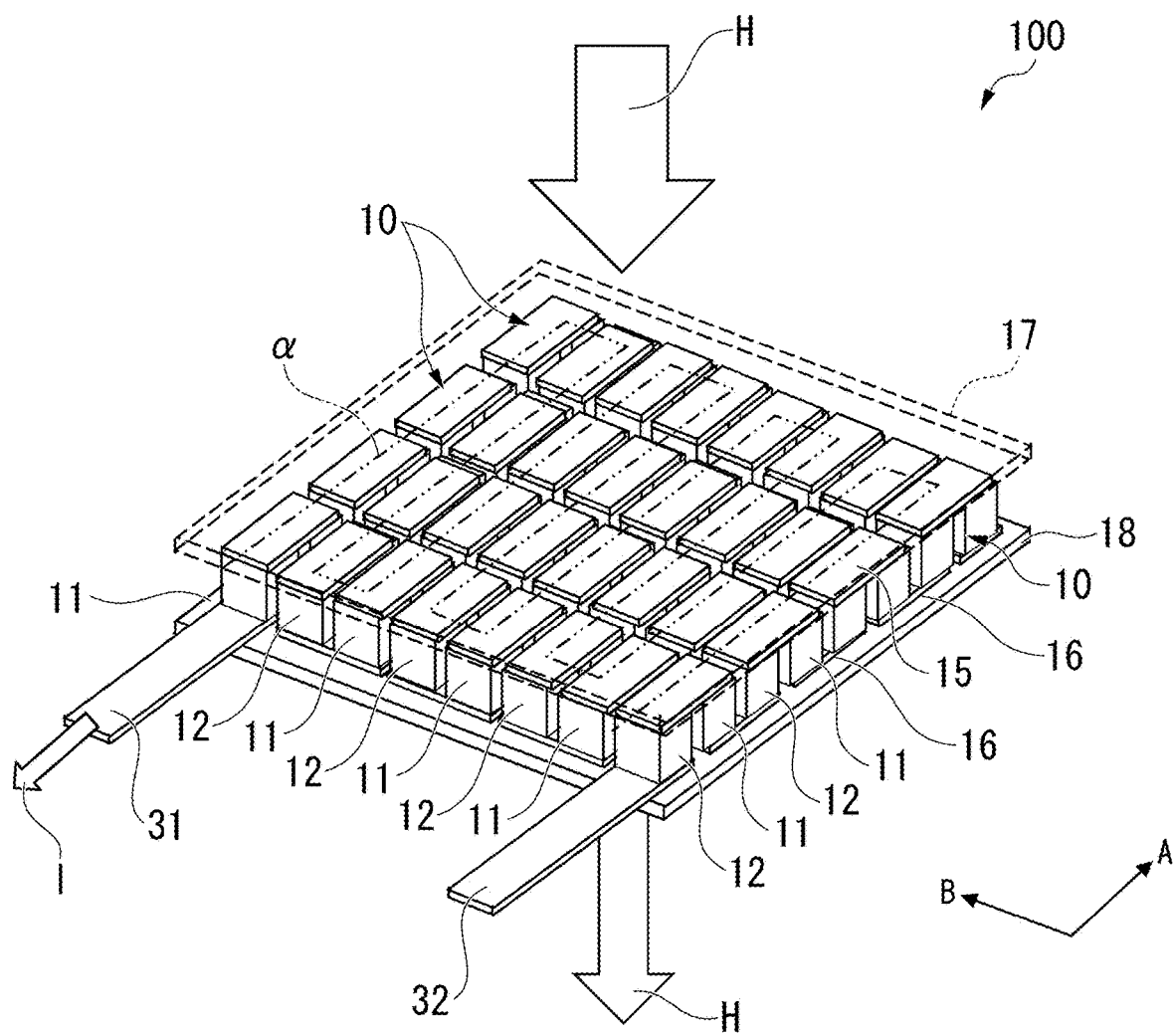
FIG. 2 is a schematic perspective view of a thermoelectric conversion module having the thermoelectric conversion device of the present embodiment.

FIG. 2 is a schematic perspective view of a thermoelectric conversion module having the above-mentioned thermoelectric conversion device.

A thermoelectric conversion module 100 is a structure formed by combining a plurality of thermoelectric conversion devices 10 into a single unit. The thermoelectric conversion module 100 has a plurality of thermoelectric conversion devices 10. The plurality of thermoelectric conversion devices 10 are arranged in a grid-like pattern between the insulating plate 17 and the radiator plate 18.

More specifically, in the thermoelectric conversion module 100, a plurality of p-type thermoelectric conversion elements 11 and a plurality of n-type thermoelectric conversion elements 12 are alternately arranged in the A direction and the B direction shown in the drawing. The relationship between the number of p-type thermoelectric conversion elements 11 (P) and the number of n-type thermoelectric conversion elements 12 (N) in the thermoelectric conversion module 100 is expressed as: P=N+1, P=N, or N=P+1.

All of the p-type thermoelectric conversion elements 11 and the n-type thermoelectric conversion elements 12 are electrically connected in series using the high temperature side electrode 15 and the low temperature side electrode 16. The thermoelectric conversion modules shown in the drawing are connected in series as illustrated by a two-dot chain line α.

It should be noted that the connection illustrated by the two-dot chain line in the drawing is merely an example, and there are no particular limitations on the connection method. It is preferable that all of the p-type thermoelectric conversion elements 11 and the n-type thermoelectric conversion elements 12 are connected to each other alternately and in series via metal electrodes.

The output of the thermoelectric conversion module 100 is almost equal to the sum of the value obtained by multiplying the output of the p-type thermoelectric conversion element 11 by the number of p-type thermoelectric conversion elements 11 used, and the value obtained by multiplying the output of the n-type thermoelectric conversion element 12 by the number of n-type thermoelectric conversion elements 12 used. In order to increase the output of the thermoelectric conversion module 100, it is effective to increase the output of the thermoelectric conversion elements or to increase the number of thermoelectric conversion elements used.

The sum of the number of p-type thermoelectric conversion elements 11 and the number of n-type thermoelectric conversion elements 12 in the thermoelectric conversion module 100 can be appropriately changed depending on conditions such as the size of the thermoelectric conversion module 100 and the required electromotive force. As an example, the sum of the number of p-type thermoelectric conversion elements 11 and the number of n-type thermoelectric conversion elements 12 in the thermoelectric conversion module 100 is preferably 50 or more and 1,000 or less, more preferably 50 or more and 500 or less, and still more preferably 50 or more and 250 or less.

An external connection electrode 31 is connected to a lower end portion of the p-type thermoelectric conversion element 11 arranged on one end side of the two-dot chain line α. Further, an external connection electrode 32 is connected to a lower end portion of the n-type thermoelectric conversion element 12 arranged on the other end side of the two-dot chain line α.

In the thermoelectric conversion module 100, the space between adjacent thermoelectric conversion elements may be filled with an insulating material. Such an insulating material can reinforce the thermoelectric conversion module 100 and improve the durability of the thermoelectric conversion module 100. In order to enhance the effect of reinforcement, it is preferable that the insulating material fills the entire space between adjacent thermoelectric conversion elements.

Further, in the thermoelectric conversion module 100, adjacent thermoelectric conversion elements may be separated from each other without filling the space between the adjacent thermoelectric conversion elements with an insulating material. When the adjacent thermoelectric conversion elements are separated from each other, a heat transfer path when the heat H input to the thermoelectric conversion module 100 is transmitted from the insulating plate 17 to the radiator plate 18 is limited to the p-type thermoelectric conversion element 11 and the n-type thermoelectric conversion element 12. Therefore, heat H that is dissipated without being input to the thermoelectric conversion element is unlikely to be generated, and as a result, a high thermoelectromotive force can be obtained.

When heat H is input from the upper side of the thermoelectric conversion module 100, an electric current I is generated from the external connection electrode 31 toward the external connection electrode 32.

Since the above-mentioned thermoelectric conversion device 10 is used in the thermoelectric conversion module 100 as described above, a thermoelectric conversion module excellent in thermal efficiency in a high temperature region is configured.

Although the preferred embodiments and examples according to the present invention have been described above with reference to the accompanying drawings, the present invention is not limited to these examples. Various shapes, combinations, and the like for the respective constituent members shown in the above-mentioned embodiments and examples are merely examples, and various changes and modifications can be made based on design requirements or the like without departing from the spirit and scope of the present invention.

Examples

The present invention will be described below with reference to examples, but the present invention is not limited to these examples.

A method shown below was used to evaluate each physical property value and structure of a compound.

1. Seebeck Coefficient

The Seebeck coefficient α [V/K] was calculated from a measured value by a thermoelectric characteristic evaluation device ZEM-3 (manufactured by Advance Riko, Inc.) in accordance with JIS R1650-1.

Compound samples used for the measurement were cut using a diamond cutter. The dimensions of the sample for which the Seebeck coefficient was measured were set to 4 mm×2 mm×2 mm. R-type thermocouples used for temperature measurement and voltage measurement were brought into contact with each other at intervals of 2.7 mm or 1.3 mm in the longitudinal direction of the sample to fix the sample.

The sample was heated to a predetermined temperature in a helium gas atmosphere (0.01 MPa). Furthermore, by heating one end of the sample, a temperature difference was generated in the height direction of the sample. At this time, the temperature difference ($\Delta T$) and the voltage difference ($\Delta V$) between the R-type thermocouples were measured. The temperature difference ($\Delta T$) was adjusted to a range of 0.5° C. or higher and 10° C. or lower.

The voltage difference ($\Delta V$) was measured when three different temperature differences ($\Delta T$) were applied. The value of the Seebeck coefficient α was calculated from the slope of the voltage difference ($\Delta V$) with respect to the temperature difference ($\Delta T$).

The Seebeck coefficient was measured when it was judged that the temperature of the sample was stable according to the following criteria.

(Criteria)

The temperature of the sample was measured every 10 seconds with the thermoelectric characteristic evaluation device, and the moving average of 5 points was calculated for the latest five measurements. At that time, the value of the 5-point moving average at a certain time was compared with the 5-point moving average of the latest five measurements 10 seconds before that time, and if the difference was smaller than 0.5° C., it was judged that the temperature of the sample was stable.

2. Resistivity

The resistivity ρ [$\Omega \cdot m$] was measured by a DC four-terminal method using a thermoelectric characteristic evaluation device (model number: ZEM-3, manufactured by Advance Riko, Inc.).

The resistivity was measured when it was judged that the temperature of the sample was stable according to the above criteria.

3. Power Factor

The power factor [W/(m·K²)] was calculated from the Seebeck coefficient α [V/K] and the resistivity ρ [Ω·m] measured by the above method using the following formula (3).

[Equation 4]

$$\text{Power Factor} = \frac{\alpha^2}{\rho} \quad (3)$$

4. Thermal Conductivity

The thermal conductivity κ [W/(m·K)] was calculated from the thermal diffusivity λ [m²/s], the heat capacity Cp [J/g], and the density d [g/m³] using the following formula (4).

[Equation 5]

$$\kappa = \lambda \times C_P \times d \quad (4)$$

Compound samples used for the measurement of the thermal diffusivity λ were cut using a diamond cutter. The dimensions of the sample for which the thermal diffusivity was measured were set to 4 mm×4 mm×0.5 mm.

5. Thermal Diffusivity

The thermal diffusivity λ was measured using a laser flash analyzer LFA457 MicroFlash (manufactured by NETZSCH-Geratebau GmbH). At the time of measurement, the surface of the sample was coated in black with a carbon spray Graphite 33 (manufactured by CRC Industries Europe BVBA).

6. Heat Capacity

The heat capacity Cp was measured using EXSTAR DSC 7020 (manufactured by SII Nanotechnology Inc.). The dimensions of the sample for which the heat capacity was measured were set to 4 mm×4 mm×0.5 mm.

7. Density

The density d was measured using a density measurement kit (manufactured by Mettler-Toledo International Inc.) at room temperature by employing the Archimedes method that uses water as the measurement principle. The dimensions of the sample for which the density was measured were set to 7 mm×4 mm×4 mm.

8. Thermoelectric Figure of Merit z

The thermoelectric figure of merit z [1/K] was calculated from the Seebeck coefficient α [V/K] at an absolute temperature T as zT, the resistivity ρ [Ω·m] and the thermal conductivity κ [W/(m·K)] using the following formula (2).

[Equation 6]

$$zT = \frac{\alpha^2}{\rho \kappa} T \quad (2)$$

9. Crystal Structure Analysis

The crystal structure of the compound was obtained by powder X-ray diffraction measurements under the following conditions using a powder X-ray diffractometer X'Pert PRO MPD (manufactured by Spectris Co., Ltd.) to analyze the obtained powder X-ray diffraction pattern.

Measuring device: powder X-ray diffractometer X'Pert PRO MPD (manufactured by Spectris Co., Ltd.)

X-ray generator: CuKα radiation source, voltage: 45 kV, electric current: 40 mA

Slit: slit width: 10 mm

X-ray detector: X'Celerator

Measurement range: diffraction angle 2θ=10° or more and 90° or less

Sample preparation: pulverization by mortar grinding

Sample stage: dedicated glass substrate, depth: 0.2 mm

10. Evaluation of Composition Distribution

The composition distribution of the compound was determined by measurements under the following conditions using a scanning electron microscope JEOL JSM-5500 (manufactured by JEOL Ltd.) equipped with an energy dispersive X-ray spectrometer JED-2300 (manufactured by JEOL Ltd.).

SEM: JEOL JSM-5500 (manufactured by JEOL Ltd.)

Accelerating voltage: 20 kV, electric current: 65 μA

EDX: JED-2300 (manufactured by JEOL Ltd.)

Analysis software: Analysis station

11. Carrier Density

The carrier density p [cm⁻³] was determined by five-terminal Hall measurement using a physical characteristic measuring device PPMS (manufactured by Quantum Design Inc.) and a dedicated DC resistance sample pack. The dimensions of the sample for which the Seebeck coefficient was measured were set to 6 mm×2 mm×0.4 mm.

Examples 1 to 6, Comparative Examples 1 to 4

The compounds of Examples 1 to 6 and Comparative Examples 1 to 4 were produced by the production method of the third embodiment described above.

The following metal materials were used as raw materials.

Sn: 3-5 mm shot, purity: 99.999% or more, manufactured by Furuuchi Chemical Corporation Te: granular, 6NS-2 Grade, manufactured by Osaka Asahi Metal Mfg. Co., Ltd.

Mg: powder 180 μm pass, purity: 99.5% or more, manufactured by Kojundo Chemical Laboratory Co., Ltd.

Bi: granular, 6N Grade, manufactured by Osaka Asahi Metal Mfg. Co., Ltd.

Sb: granular, 6NS-2 Grade, manufactured by Osaka Asahi Metal Mfg. Co., Ltd.

Cu: powder 850 μm pass, purity: 99.999% or more, manufactured by Kojundo Chemical Laboratory Co., Ltd.

In: granular, purity: 99.999% or more, manufactured by Kojundo Chemical Laboratory Co., Ltd.

Each raw material was weighed according to the composition ratio (molar ratio) shown in the following Table 1 and mixed to obtain a mixture. Subsequently, 3.0 g of the mixture was placed in a quartz ampoule (hemispherical bottom type, inner diameter: 6 mm, outer diameter: 8 mm) and sealed under a reduced pressure of 1×10⁻³ Pa or less. The quartz ampoule was heated to 950° C. in an electric furnace to melt the mixture.

In the quenching step, the quartz ampoule was taken out from the inside of the electric furnace at 950° C. and immediately placed in water at room temperature. By this operation, the melt in the quartz ampoule was rapidly cooled and solidified. In the quenching step, the melt at 950° C. was cooled to 100° C. or lower within 1 minute. A solidified material obtained by solidification of the melt was recovered from the quartz ampoule.

The obtained solidified material was ground in a mortar to obtain a material powder. The material powder was filled in a dedicated carbon die and subjected to discharge plasma sintering under the following conditions. The sintered material powder was rapidly cooled by stopping the plasma discharge to obtain the desired compound.

Apparatus: Dr. Sinter Lab SPS-5115 (manufactured by Fuji Electronic Industrial Co., Ltd.)
Sample: material powder 2.5 g
Die: carbon die dedicated to the apparatus, inner diameter: 10 mmφ
Atmosphere: argon 0.05 MPa
Pressure: 40 MPa (3.1 kN)
Heating: 600° C., 10 minutes Table 1 shows the compositions of the compounds of Examples 1 to 6 and Comparative Examples 1 to 4. It should be noted that the compound of Comparative Example 1 is a compound having the composition disclosed in the above-described Non-Patent Document 1. Further, the compound of Comparative Example 2 is a compound having the composition disclosed in the above-described Non-Patent Document 2.

TABLE 1

| | Composition | $Sn_{1+a-b-c1-c2-d-e}Mg_b Bi_{c1} Sb_{c2} In_d M_e Te_{1-f} X_f$ | | | | | | |
| --- | --- | --- | --- | --- | --- | --- | --- | --- |
| | | a | b | c1 | c2 | d | e | f |
| Ex. 1 | $Sn_{0.85}Mg_{0.10}Bi_{0.05}Cu_{0.05}Te$ | 0.05 | 0.10 | 0.05 | 0 | 0 | 0.05 (M=Cu) | 0 |
| Ex. 2 | $Sn_{0.90}Mg_{0.10}Sb_{0.05}Te$ | 0.05 | 0.10 | 0 | 0.05 | 0 | 0 | 0 |
| Ex. 3 | $Sn_{0.90}Mg_{0.10}Bi_{0.05}Te$ | 0.05 | 0.10 | 0.05 | 0 | 0 | 0 | 0 |
| Ex. 4 | $Sn_{0.88}Mg_{0.10}Bi_{0.07}Te$ | 0.05 | 0.10 | 0.07 | 0 | 0 | 0 | 0 |
| Ex. 5 | $Sn_{0.95}Mg_{0.05}Bi_{0.05}Te$ | 0.05 | 0.05 | 0.05 | 0 | 0 | 0 | 0 |
| Ex. 6 | $Sn_{0.86}Mg_{0.14}Bi_{0.05}Te$ | 0.05 | 0.14 | 0.05 | 0 | 0 | 0 | 0 |
| Comp. Ex. 1 | $Sn_{0.94}Mg_{0.09}Te$ | 0.03 | 0.09 | 0 | 0 | 0 | 0 | 0 |
| Comp. Ex. 3 | $Sn_{0.94}Bi_{0.06}Te$ | 0 | 0 | 0.06 | 0 | 0 | 0 | 0 |
| Comp. Ex. 4 | SnTe | 0 | 0 | 0 | 0 | 0 | 0 | 0 |
| Comp. Ex. 2 | $Sn_{0.91}Mg_{0.12}Te(Cu_2Te)_{0.05}$ | | | | | | | |

Figure 3:
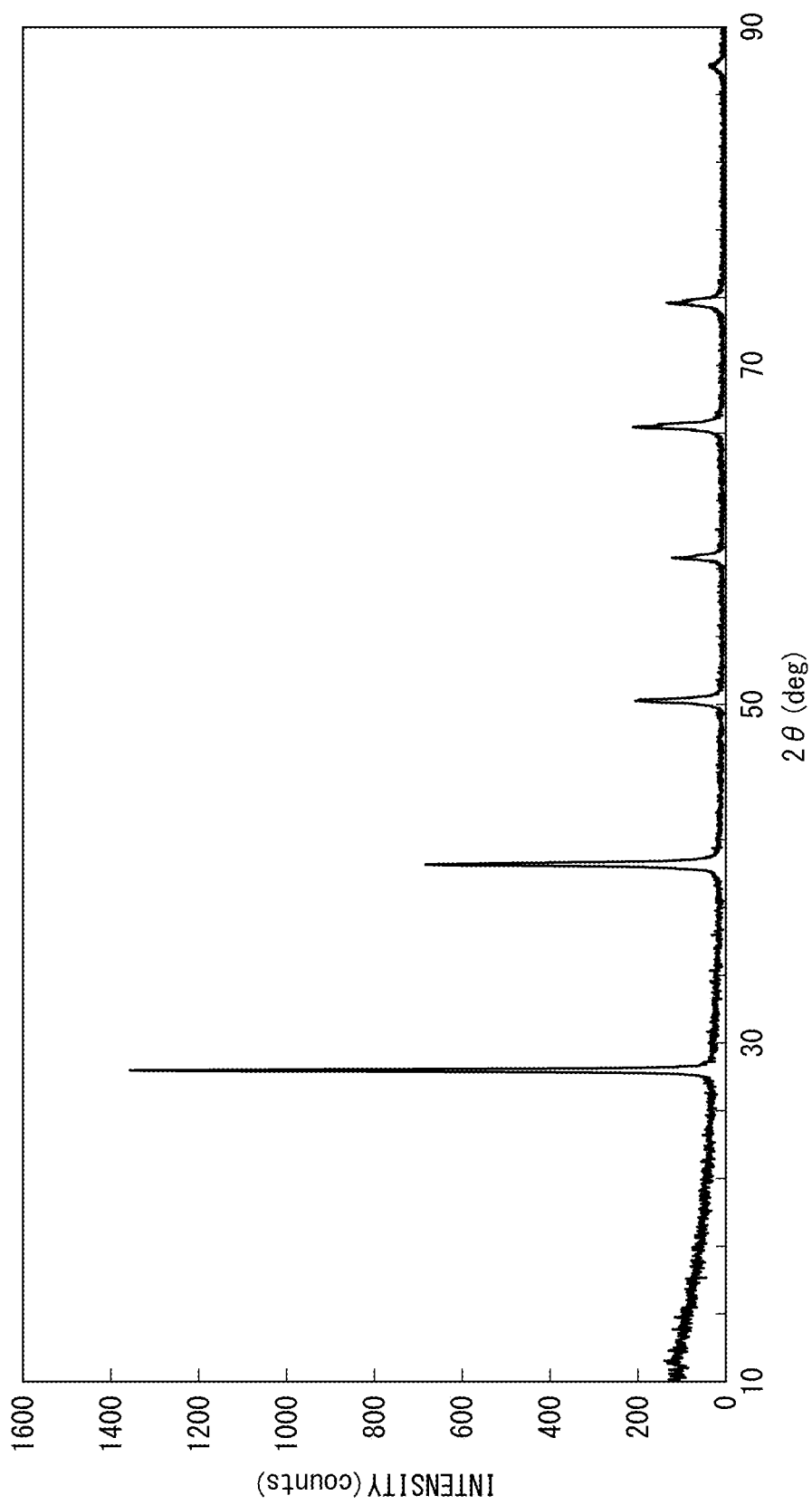
FIG. 3 is a powder X-ray diffraction pattern of a compound of Example 1.

FIG. 3 is a powder X-ray diffraction pattern of the compound of Example 1. As a result of the measurement, it was found that all the crystal structures of the compounds of Examples 1 to 6 and Comparative Examples 1 to 4 were assigned to Fm-3m and were cubic, and the main phases were SnTe.

FIG. 4 is a graph showing the temperature dependence of Seebeck coefficients α of the compounds of Examples 1 to 6 and Comparative Examples 1 to 4.

Figure 5:
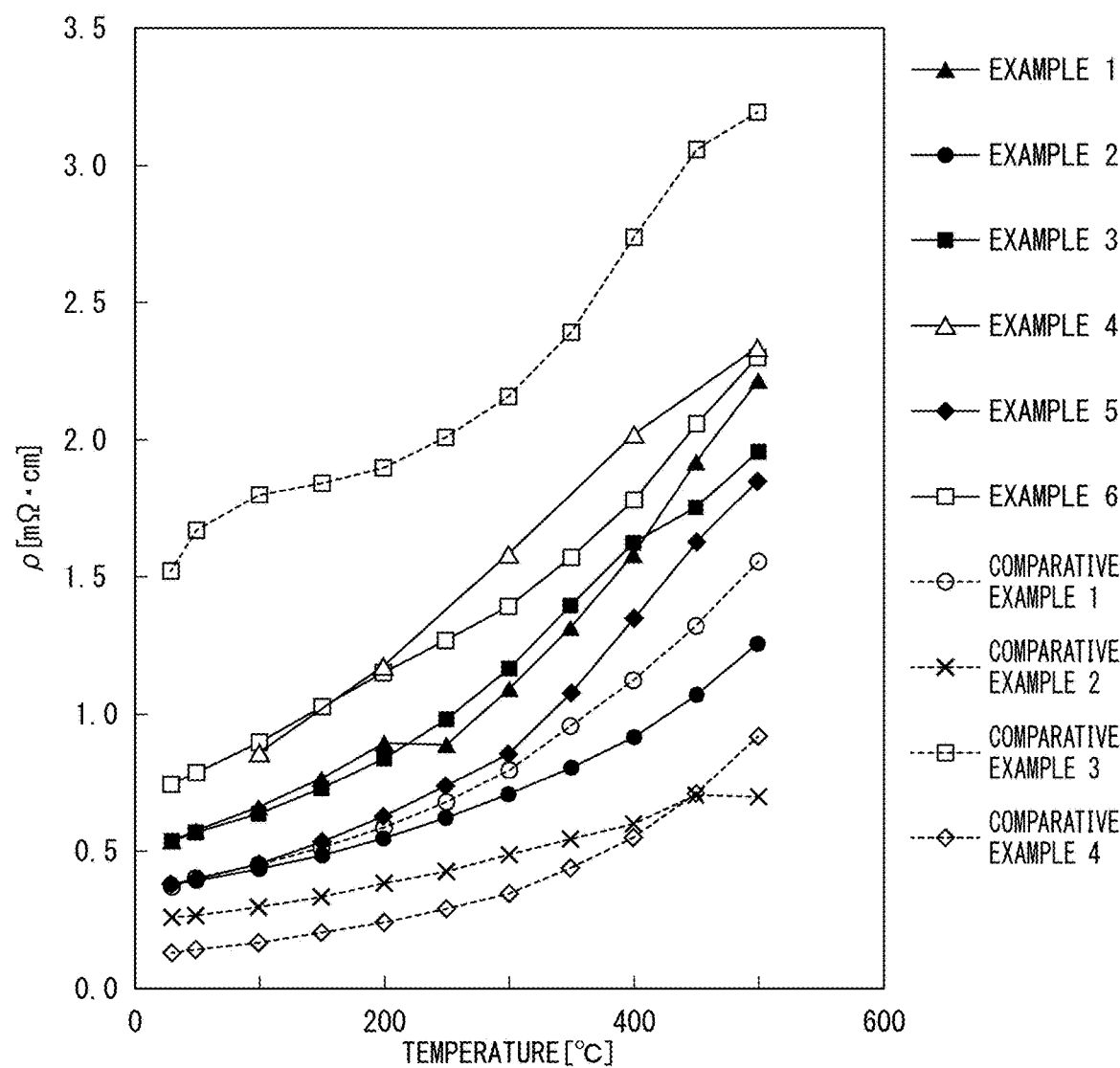
FIG. 5 is a graph showing the temperature dependence of resistivities ρ of the compounds of Examples 1 to 6 and Comparative Examples 1 to 4.

FIG. 5 is a graph showing the temperature dependence of resistivities ρ of the compounds of Examples 1 to 6 and Comparative Examples 1 to 4.

Figure 6:
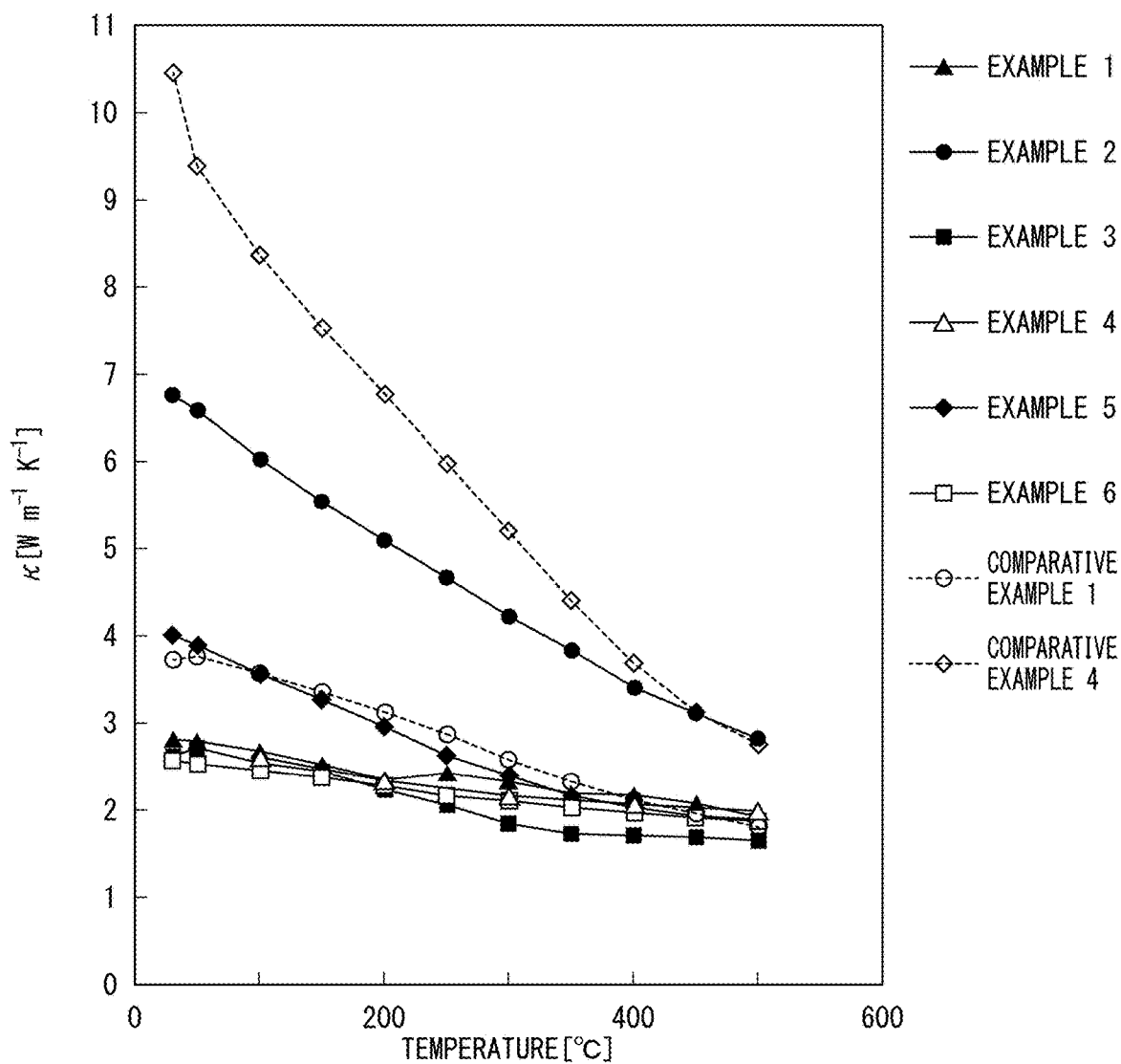
FIG. 6 is a graph showing the temperature dependence of thermal conductivities κ of the compounds of Examples 1 to 6 and Comparative Examples 1 and 4.

FIG. 6 is a graph showing the temperature dependence of thermal conductivities κ of the compounds of Examples 1 to 6 and Comparative Examples 1 and 4.

Figure 7:
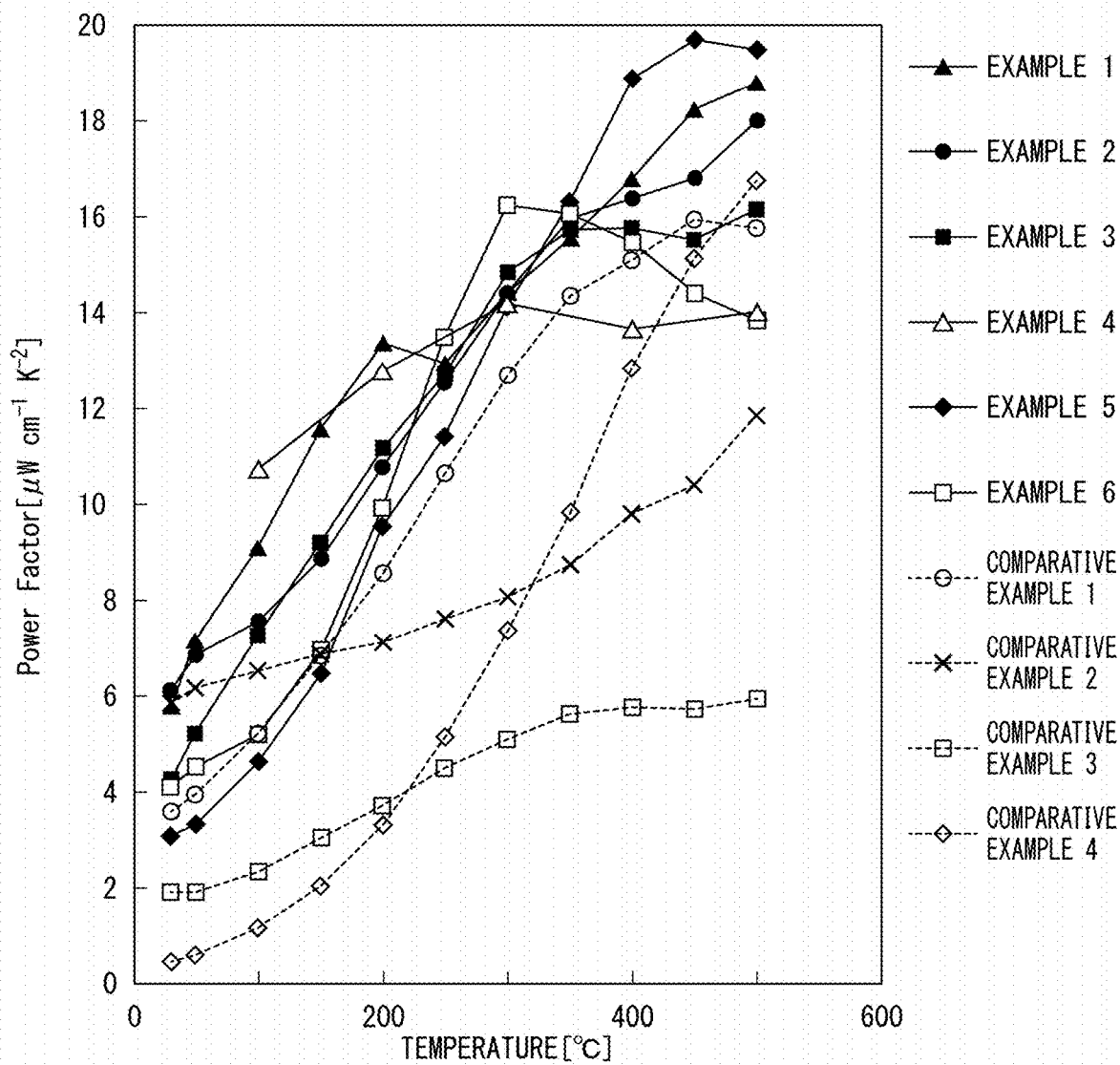
FIG. 7 is a graph showing the temperature dependence of power factors of the compounds of Examples 1 to 6 and Comparative Examples 1 to 4.

FIG. 7 is a graph showing the temperature dependence of power factors of the compounds of Examples 1 to 6 and Comparative Examples 1 to 4.

Figure 8:
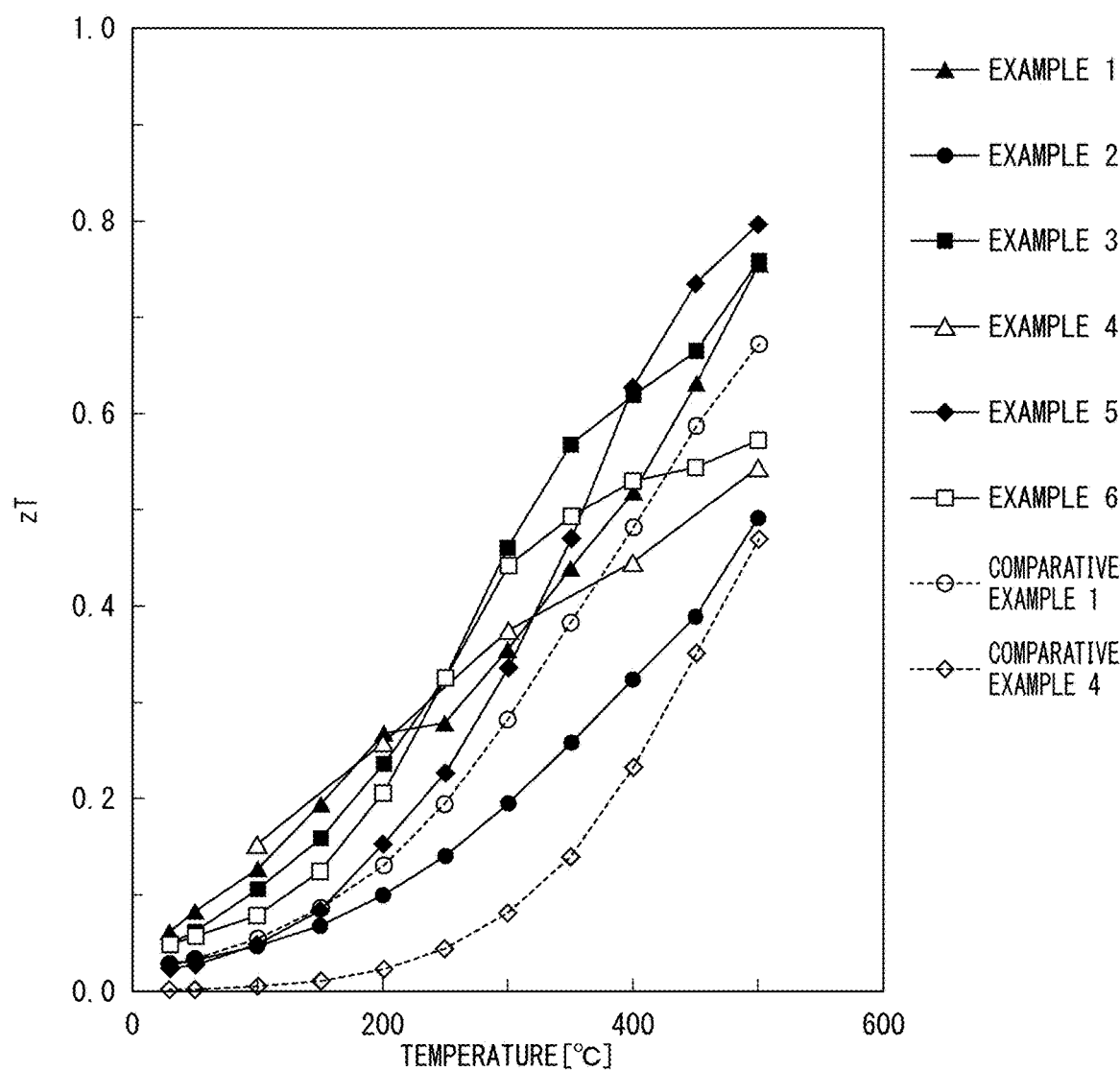
FIG. 8 is a graph showing the temperature dependence of zT of the compounds of Examples 1 to 6 and Comparative Examples 1 and 4.

FIG. 8 is a graph showing the temperature dependence of zT of the compounds of Examples 1 to 6 and Comparative Examples 1 and 4.

It can be seen that Examples 3, 4 and 6 have higher Seebeck coefficients and lower thermal conductivities than those of Comparative Example 1.

Table 2 shows the power factors of the compounds of Examples 1 to 6 and Comparative Examples 1 to 4 at 300° C.

TABLE 2

| No. | Main phase | Power factor [μW/(cm K²)] (at 300° C.) |
| --- | --- | --- |
| Ex. 1 | SnTe | 14.42 |
| Ex. 2 | SnTe | 14.39 |
| Ex. 3 | SnTe | 14.83 |
| Ex. 4 | SnTe | 14.19 |
| Ex. 5 | SnTe | 14.11 |
| Ex. 6 | SnTe | 16.25 |
| Comp. Ex. 1 | SnTe | 12.71 |
| Comp. Ex. 3 | SnTe | 5.08 |
| Comp. Ex. 4 | SnTe | 7.35 |
| Comp. Ex. 2 | SnTe | 8.06 |

As shown in Table 2, it can be seen that the power factors of the compounds of Examples 1 to 6 are higher than the power factors of the compounds of Comparative Examples 1 to 4 in a high temperature region of 300° C.

Figure 9:
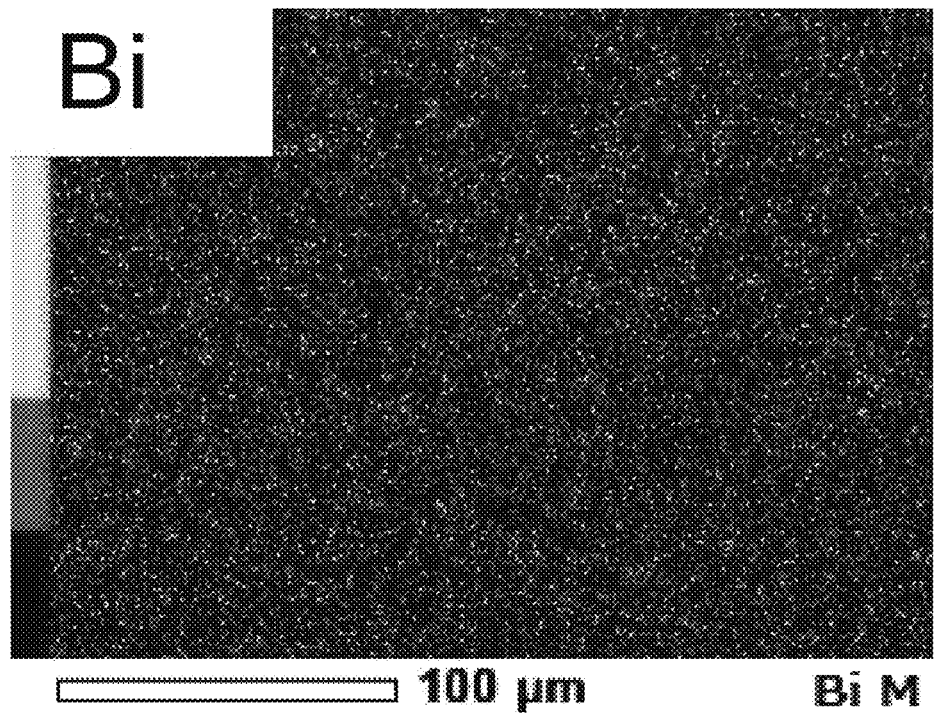
FIG. 9 is a SEM-EDX photograph obtained by measuring the distribution of Bi for the compound of Example 1.
Figure 10:
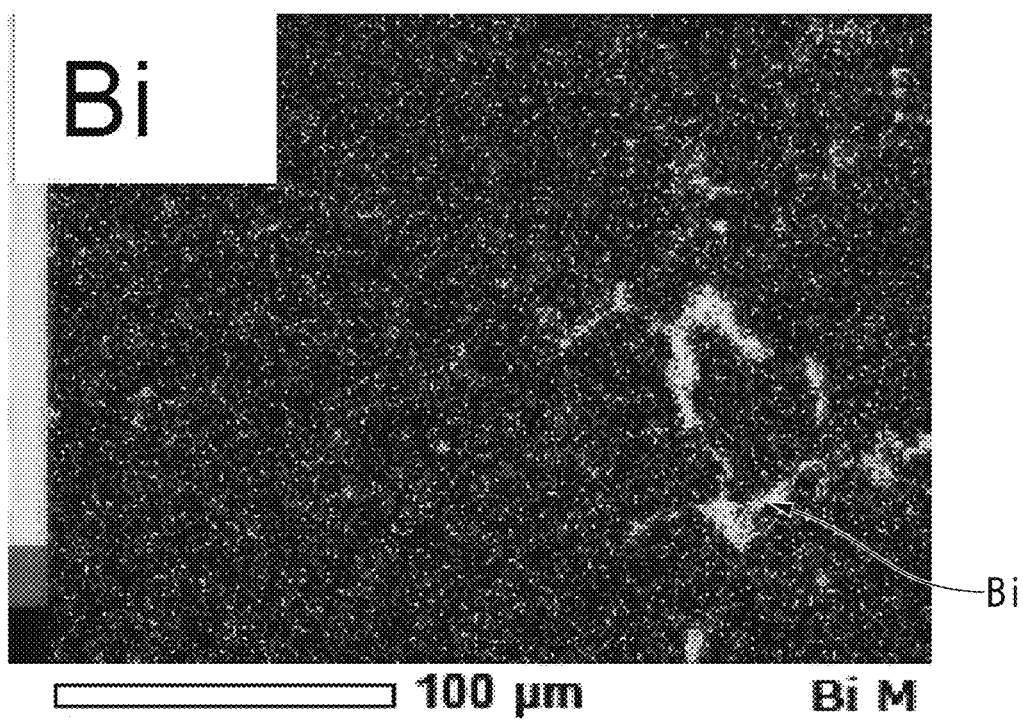
FIG. 10 is a SEM-EDX photograph obtained by measuring the distribution of Bi for the compound of Comparative Example 3.

FIG. 9 is a SEM-EDX photograph obtained by measuring the distribution of Bi for the compound of Example 1. FIG. 10 is a SEM-EDX photograph obtained by measuring the distribution of Bi for the compound of Comparative Example 3.

As shown in FIG. 9, in the compound of Example 1, the aggregation of Bi was not observed, and it can be seen that Bi was dispersed throughout the compound.

On the other hand, as shown in FIG. 10, the aggregation of Bi was confirmed in the compound of Comparative Example 3. It is considered that in the compound of Comparative Example 3, Bi could not be stably present in the crystal lattice, and the power factor was lowered as a result of the aggregation of Bi in the compound.

INDUSTRIAL APPLICABILITY

Since the compound of the present invention exhibits an excellent power factor even in a high temperature region, a thermoelectric conversion device provided with a thermoelectric conversion material containing the compound of the present invention can be applied to various fields, such as in-vehicle applications.

REFERENCE SIGNS LIST

10: Thermoelectric conversion device; 11: p-type thermoelectric conversion element; 12: n-type thermoelectric conversion element; 15: High temperature side electrode; 16: Low temperature side electrode; 17: Insulating plate; 18: Radiator plate; 31: External connection electrode; 32: External connection electrode; 50: External load; 100: Thermoelectric conversion module; 111, 121: Thermoelectric conversion layer; 112, 122: Bonding layer; 113, 123: Diffusion prevention layer; 161: Electrode (low temperature side electrode); 162: Electrode (low temperature side electrode)

The invention claimed is:

1. A compound comprising Sn, Te and Mg, and further comprising either one or both of Sb and Bi, which comprises SnTe as a main phase, wherein the crystal structure of the SnTe is cubic with a space group Fm-3m at 25° C.

2. The compound according to claim 1, further comprising at least one element selected from the group consisting of Mn, In, Na, Al, Si, K, Ca, Sr, Ba, Cu, Ag, Au, Sc, Ti, V, Cr, Fe, Co, Ni, Zn, Ga, Ge, As, Y, Zr, Nb, Mo, Tc, Ru, Rh, Pd, Cd, Cs, La, Ce, Pr, Nd, Pm, Sm, Eu, Gd, Tb, Dy, Ho, Er, Tm, Yb, Lu, Hf, Ta, W, Re, Os, Ir, Pt, Hg, Tl, Pb, S, Se, Cl, Br and I.

3. The compound according to claim 2, wherein said element is at least one element selected from the group consisting of Cu, In and Se.

4. The compound according to claim 1 which is represented by the following formula (A):

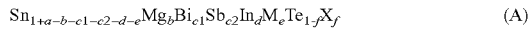 (A)

$$Sn_{1+a-b-c1-c2-d-e}Mg_bBi_{c1}Sb_{c2}In_dM_eTe_{1-f}X_f$$

wherein M represents at least one element selected from the group consisting of Mn, Na, Al, Si, K, Ca, Sr, Ba, Cu, Ag, Au, Sc, Ti, V, Cr, Fe, Co, Ni, Zn, Ga, Ge, As, Y, Zr, Nb, Mo, Tc, Ru, Rh, Pd, Cd, Cs, La, Ce, Pr, Nd, Pm, Sm, Eu, Gd, Tb, Dy, Ho, Er, Tm, Yb, Lu, Hf, Ta, W, Re, Os, Ir, Pt, Hg, Tl and Pb, X represents at least one element selected from the group consisting of Se, S, Br, I and Cl, and a, b, c1, c2, d, e and f are numbers satisfying: $0 \leq a \leq 0.10$, $0 < b < 0.15$, $0 \leq c1 \leq 0.10$, $0 \leq c2 \leq 0.10$, $0 \leq d \leq 0.03$, $0 \leq e \leq 0.20$, and $0 \leq f \leq 0.20$, provided that $0 < c1+c2$.

5. The compound according to claim 4, wherein $0 \leq e \leq 0.10$.

6. The compound according to claim 4, wherein $0.005 \leq e \leq 0.05$.

7. The compound according to claim 4, wherein $0 \leq d \leq 0.07$.

8. The compound according to claim 4, wherein $0 \leq f \leq 0.20$.

9. The compound according to claim 5, wherein $0.04 \leq f \leq 0.10$.

10. The compound according to claim 1 comprising Sb.

11. The compound according to claim 1, comprising Bi.

12. The compound according to claim 1, comprising Sb and Bi.

13. The compound according to claim 1, further comprising at least one element selected from the group consisting of Cu, In, and Se.

14. The compound according to claim 1, further comprising Cu.

15. The compound according to claim 1, further comprising In.

16. The compound according to claim 1, further comprising Se.

17. The compound according to claim 1 having a carrier density of $8.0 \times 10^{20}$ cm$^{-3}$ or less.

18. The compound according to claim 1 having a Seebeck coefficient [μV/K] at 300° C. of 90 or more.

19. A thermoelectric conversion material comprising the compound according to claim 1.

* * * * *